United States Patent
Wang

(10) Patent No.: US 10,622,526 B2
(45) Date of Patent: Apr. 14, 2020

(54) LIGHT EMITTING DEVICE AND METHOD FOR MANUFACTURING LIGHT EMITTING DEVICE

(71) Applicant: Yang Wang, Dublin, CA (US)

(72) Inventor: Yang Wang, Dublin, CA (US)

( * ) Notice: Subject to any disclaimer, the term of this patent is extended or adjusted under 35 U.S.C. 154(b) by 0 days.

(21) Appl. No.: 16/185,726

(22) Filed: Nov. 9, 2018

(65) Prior Publication Data

US 2019/0148607 A1    May 16, 2019

Related U.S. Application Data

(62) Division of application No. 15/588,688, filed on May 7, 2017, now abandoned.

(51) Int. Cl.
| | |
|---|---|
| H01L 33/54 | (2010.01) |
| H01L 33/56 | (2010.01) |
| H01L 33/48 | (2010.01) |
| H01L 33/62 | (2010.01) |
| H01L 33/58 | (2010.01) |
| G06K 9/20 | (2006.01) |
| G06K 9/00 | (2006.01) |
| H01L 33/00 | (2010.01) |

(52) U.S. Cl.
CPC .......... *H01L 33/54* (2013.01); *H01L 33/0058* (2013.01); *H01L 33/486* (2013.01); *H01L 33/56* (2013.01); *H01L 33/58* (2013.01); *H01L 33/62* (2013.01); *G06K 9/00604* (2013.01); *G06K 9/2036* (2013.01); *H01L 2933/005* (2013.01); *H01L 2933/0033* (2013.01)

(58) Field of Classification Search
CPC ... H01L 33/54; H01L 33/56; H01L 2933/005; H01L 2933/0058; H01L 33/48; H01L 33/483; H01L 33/486; G06K 9/00604; G06K 9/2036
USPC ..................................................... 257/98, 99
See application file for complete search history.

(56) References Cited

U.S. PATENT DOCUMENTS

| | | | | |
|---|---|---|---|---|
| 4,070,105 A | * | 1/1978 | Marzouk .................. | G02C 7/02 351/159.62 |
| 4,787,722 A | * | 11/1988 | Claytor .................... | G02B 3/08 359/708 |
| 4,815,084 A | * | 3/1989 | Scifres .................. | H01S 5/0425 257/98 |

(Continued)

FOREIGN PATENT DOCUMENTS

DE    102013101532 A1 *  8/2014  .......... G02B 26/005

*Primary Examiner* — Victoria K. Hall
(74) *Attorney, Agent, or Firm* — Jigang Jin

(57) ABSTRACT

A light-emitting device and a method of manufacturing the device are disclosed in this invention. The light-emitting device includes a molded body having metal leads and a plane surface for mounting a light-emitting element. The light-emitting device also includes a lens having one central portion, one edge portion surrounding the central portion, and one base portion supporting the central portion and the edge portion. The central portion has a dome-shaped top surface. The edge portion has one inner top surface and one outer top surface, and the inner top surface of the edge portion connects with the dome-shaped top surface of the central portion to form a valley-shaped groove. The base portion is attached onto the molded body to form a sealed chamber to enclose the light-emitting element.

10 Claims, 15 Drawing Sheets

(56) References Cited

U.S. PATENT DOCUMENTS

| | | | | |
|---|---|---|---|---|
| 5,130,531 A * | 7/1992 | Ito | | G01V 8/14 250/216 |
| 5,894,195 A * | 4/1999 | McDermott | | H01L 33/54 257/E33.059 |
| 5,924,942 A * | 7/1999 | Gentile | | A63B 43/06 446/267 |
| 6,243,215 B1 * | 6/2001 | Hirota | | G02B 3/08 359/742 |
| 6,621,631 B2 * | 9/2003 | Lissotshenko | | G02B 6/4204 359/566 |
| 6,987,613 B2 * | 1/2006 | Pocius | | G02B 5/32 257/98 |
| 7,352,011 B2 * | 4/2008 | Smits | | H01L 33/54 257/100 |
| 7,458,703 B2 * | 12/2008 | Han | | H01L 33/58 257/98 |
| 7,473,013 B2 * | 1/2009 | Shimada | | F21V 5/04 257/98 |
| 7,572,654 B2 * | 8/2009 | Chang | | H01L 33/58 438/29 |
| 7,717,589 B2 * | 5/2010 | Nishioka | | H01L 33/507 257/100 |
| 7,728,399 B2 * | 6/2010 | Walberg | | G02B 6/423 257/100 |
| 7,816,697 B1 * | 10/2010 | Spurlock | | H01L 31/02325 257/98 |
| 8,344,310 B2 * | 1/2013 | Toda | | G02B 5/188 250/216 |
| 8,351,219 B2 * | 1/2013 | Lin | | H01L 27/14618 257/432 |
| 8,403,512 B2 * | 3/2013 | Tsukahara | | G02F 1/133603 257/98 |
| 8,496,852 B2 * | 7/2013 | De Graaf | | C04B 35/6261 252/301.4 R |
| 8,770,783 B2 * | 7/2014 | Opolka | | F21L 4/027 362/187 |
| 8,847,477 B2 * | 9/2014 | Kawashima | | H05B 45/00 313/498 |
| 9,328,896 B2 * | 5/2016 | Kim | | F21V 5/04 |
| 9,377,179 B2 * | 6/2016 | Tukker | | G02B 19/0028 |
| 9,760,775 B1 * | 9/2017 | Lin | | G06K 9/00604 |
| 9,784,430 B2 * | 10/2017 | Shen | | F21K 9/233 |
| 10,359,545 B2 * | 7/2019 | Smith | | G02B 3/08 |
| 2002/0085390 A1 * | 7/2002 | Kiyomoto | | B60Q 1/302 362/555 |
| 2004/0036080 A1 * | 2/2004 | Bogner | | H01L 33/08 257/98 |
| 2004/0080251 A1 * | 4/2004 | Steranka | | H01L 33/46 313/113 |
| 2005/0024746 A1 * | 2/2005 | Shimura | | F21V 5/045 359/742 |
| 2006/0078246 A1 * | 4/2006 | Ashida | | G02B 3/0031 385/14 |
| 2007/0069230 A1 * | 3/2007 | Yu | | H01L 33/58 257/98 |
| 2007/0114551 A1 * | 5/2007 | Kawaguchi | | H01L 33/58 257/98 |
| 2007/0114553 A1 * | 5/2007 | Nagasaka | | G02B 6/4201 257/98 |
| 2007/0170449 A1 * | 7/2007 | Anandan | | G02F 1/133603 257/98 |
| 2007/0224091 A1 * | 9/2007 | Okayama | | B01J 19/0046 422/131 |
| 2008/0142822 A1 * | 6/2008 | Kim | | H01L 33/54 257/98 |
| 2008/0157110 A1 * | 7/2008 | Huang | | H01L 33/20 257/98 |
| 2009/0135480 A1 * | 5/2009 | Kojima | | G02B 5/0215 359/457 |
| 2009/0141516 A1 * | 6/2009 | Wu | | H01L 33/60 362/609 |
| 2009/0146158 A1 * | 6/2009 | Park | | G02B 5/1876 257/89 |
| 2009/0267092 A1 * | 10/2009 | Fukshima | | H01L 33/20 257/98 |
| 2009/0272990 A1 * | 11/2009 | Sun | | G02B 19/0028 257/89 |
| 2009/0321767 A1 * | 12/2009 | Shih | | F21V 5/04 257/98 |
| 2010/0019265 A1 * | 1/2010 | Sormani | | H01L 33/505 257/98 |
| 2010/0172140 A1 * | 7/2010 | Chen | | F21V 5/04 362/311.02 |
| 2010/0181590 A1 * | 7/2010 | Chen | | F21K 9/00 257/98 |
| 2010/0201280 A1 * | 8/2010 | McKenzie | | H01L 33/46 315/246 |
| 2010/0202131 A1 * | 8/2010 | Kim | | H01L 33/58 362/97.1 |
| 2010/0237360 A1 * | 9/2010 | Kao | | G02B 27/0955 257/88 |
| 2010/0328517 A1 * | 12/2010 | Mathieu | | G02B 27/0037 348/340 |
| 2011/0062469 A1 * | 3/2011 | Camras | | H01L 33/58 257/98 |
| 2011/0148270 A1 * | 6/2011 | Bhairi | | F21V 5/04 313/46 |
| 2012/0008204 A1 * | 1/2012 | Kobayashi | | G02B 27/2285 359/475 |
| 2012/0146074 A1 * | 6/2012 | Ariizumi | | H01L 33/54 257/98 |
| 2012/0161180 A1 * | 6/2012 | Komatsu | | H01L 33/486 257/98 |
| 2013/0021776 A1 * | 1/2013 | Veerasamy | | F21V 7/0083 362/84 |
| 2013/0089236 A1 * | 4/2013 | Malhas | | G06K 9/2036 382/103 |
| 2013/0240928 A1 * | 9/2013 | Jang | | F21V 5/04 257/98 |
| 2014/0177246 A1 * | 6/2014 | Lai | | H01L 33/0095 362/487 |
| 2014/0239336 A1 * | 8/2014 | Streppel | | F21V 5/045 257/98 |
| 2015/0129902 A1 * | 5/2015 | Iino | | H01L 33/505 257/88 |
| 2015/0371975 A1 * | 12/2015 | Shimizu | | H01L 33/486 257/88 |
| 2016/0056348 A1 * | 2/2016 | Lee | | H01L 33/507 349/64 |
| 2019/0063694 A1 * | 2/2019 | Kang | | F21V 5/04 |

* cited by examiner

US 10,622,526 B2

LIGHT EMITTING DEVICE AND METHOD FOR MANUFACTURING LIGHT EMITTING DEVICE

CROSS-REFERENCE TO RELATED APPLICATION

This application is a divisional of and claims priority to U.S. patent application Ser. No. 15/588,688, filed May 7, 2017, the content of which is incorporated herein by reference in its entirety.

FIELD OF INVENTION

This invention generally relates to a light emitting device and to a method of manufacturing such a light emitting device.

BACKGROUND OF THE INVENTION

Iris biometrics is now considered one of the trilogy of the most important biometrics: face, fingerprint, and iris. The U.S. military is utilizing iris recognition to help prevent terrorism. Several nations around the world are in the process of creating National ID programs that will include all three of these biometrics. FIG. 1 is a schematic diagram illustrating an iris recognition system. As shown, a typical iris recognition system includes three key components: a light source, a camera unit, and a data processing unit. Natural light often reflects off the iris, creating glare that can obstruct part of the view of the iris. To avoid such glare, the light source generally uses infrared light as illumination, which is invisible to the human eye. The camera unit uses an infrared camera to take a clear and detailed image of the iris and sends the image to the data processing unit for processing and recognition.

Nowadays, iris recognition systems have been made as small standalone devices or incorporated into various consumer electronics, such as mobile phones, tablet computers, personal computers, laptop computers, or webcams. As such, the size of the system needs to be made smaller and smaller. As part of the solution, infrared light-emitting diodes (or IR LEDs) have been widely used for making the light sources. Such an IR LED based light source generally also includes a substrate for mounting the IR LED and a lens for focusing the light emitted by the IR LED.

IR LED based light sources for iris recognition systems are currently available on the market. But they are expensive and difficult to make. Their manufacturing process requires cutting a sheet of substrate into individual substrates, mounting a LED onto each substrate, bonding a supporting structure with each substrate, and bonding a lens with the supporting structure. The supporting structures and the lenses are separately molded and cut into individual pieces before bonding with each substrate. Such manufacturing process is complicated and difficult to scale for mass production.

U.S. Pat. No. 8,530,250 to Ichikawa et al. ("Ichikawa") discloses a method for mass producing LED devices having resin packages. According to the disclosed method, a thermosetting resin is molded together with a lead frame to create a resin-molded body, LEDs are installed inside the concave portions of the resin-molded body and are sealed by a sealing member (e.g., epoxy resin, modified epoxy resin, silicone resin, modified silicone resin, acrylate resin and urethane resin of a thermosetting resin), and the resin-molded body are cut into individual LED devices. However, such LED devices do not have light focusing lenses and therefore cannot be used as light sources for iris recognition systems. Furthermore, the disclosed device's LED is already covered by a sealing member made from epoxy resin or similar polymer material, lenses made from such materials won't be effective in focusing light emitted from the LED.

SUMMARY OF THE INVENTION

In one embodiment of the present invention, a light-emitting device is provided. The light-emitting device includes a molded body having metal leads and a plane surface for mounting a light-emitting element. The light-emitting device also includes a lens having one central portion, one edge portion surrounding the central portion, and one base portion supporting the central portion and the edge portion. The central portion has a dome-shaped top surface. The edge portion has one inner top surface and one outer top surface, and the inner top surface of the edge portion connects with the dome-shaped top surface of the central portion to form a valley-shaped groove. The base portion is attached onto the molded body to form a sealed chamber to enclose the light-emitting element. The cross-sectional line of the outer top surface may be a straight or curved line, and in either case, any angle formed by any plane tangent to the outer top surface of the edge portion and a central axis of the central portion is between 0-45°.

In one embodiment, the sealed chamber is a vacuum chamber or contains air or special gas (e.g., dinitrogen, argon, inert gas). The sealed chamber has a different optical refractive index from the surrounding materials and is necessary to obtain the desired beam angle. It also helps to protect the light-emitting elements from being contaminated by dusts created during the cutting process of mass production. The light-emitting element used in the present invention may be an IR (infrared) LED or a LED producing any light wavelength. The light-emitting element may be a lateral, vertical or flip chip. Also, the light-emitting element may be a CSP (chip-scale package) chip, white chip, VCSEL (vertical-cavity surface-emitting laser) chip, or SLED (super luminescent diode) chip. Alternatively, the light-emitting element may also be a die array.

In addition, a method of manufacturing the light-emitting device is provided. The method includes providing a first sheet of molded structure comprising a plurality of molded bodies having metal leads; placing a second sheet of molded structure comprising a plurality of lenses on top of the first sheet of molded structure; bonding the first sheet of molded structure with the second sheet of molded structure to create a bonded structure so that each molded body forms a sealed chamber with a corresponding lens to enclose a light-emitting element; and cutting the bonded structure to create light emitting devices. As discussed above, the sealed chambers help to protect the light-emitting elements from being contaminated by dust created during the cutting process.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings.

DETAILED DESCRIPTION

Figure 1:
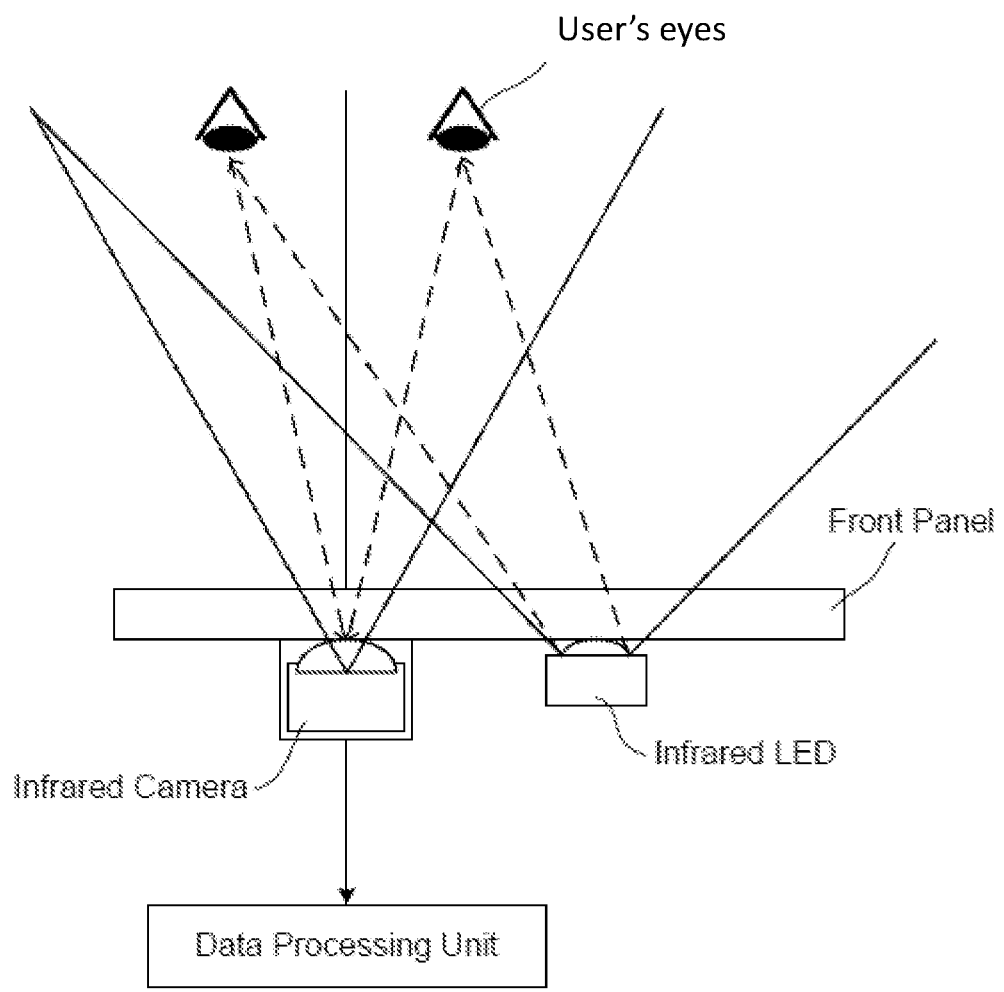
FIG. 1 is a schematic diagram illustrating an iris recognition system.
Figure 2:
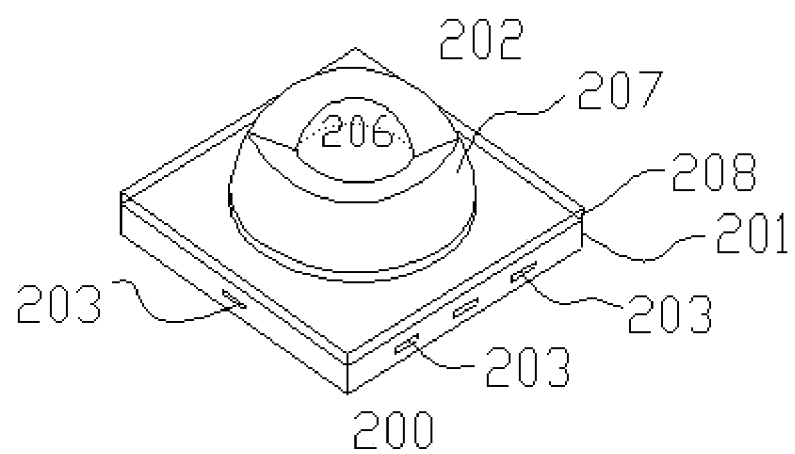
FIG. 2 is a three-dimensional illustration of an embodiment of a light-emitting device according to the invention.
Figure 3:
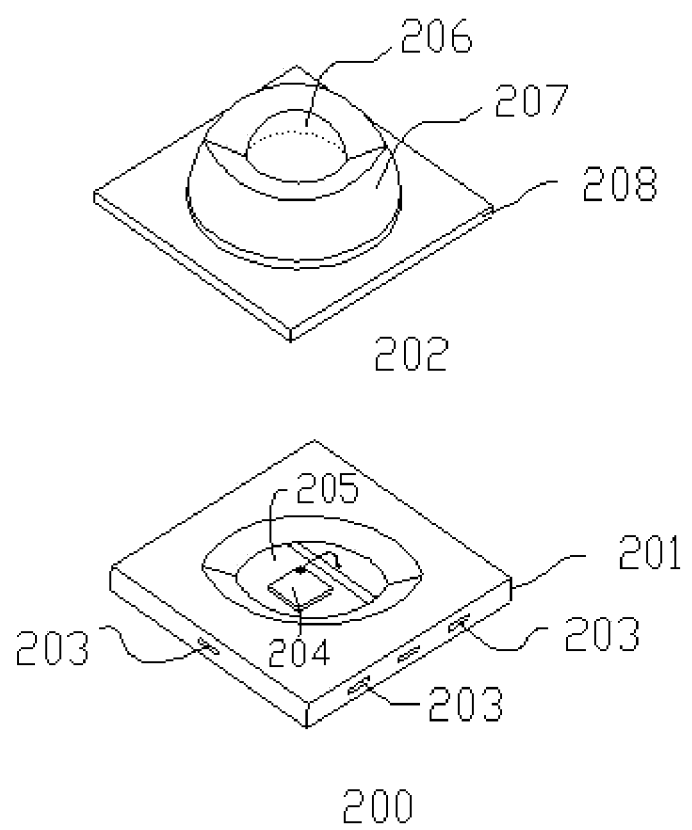
FIG. 3 is an exploded view of the embodiment shown in FIG. 2.
Figure 4A:
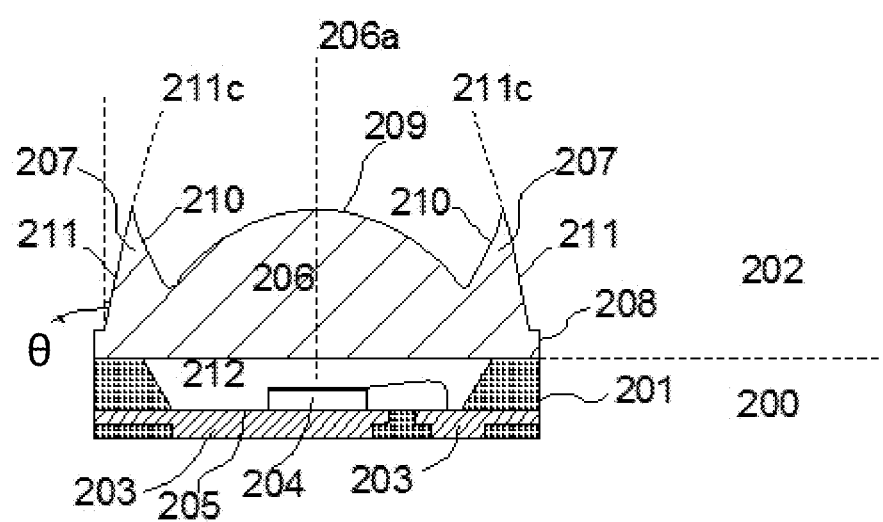
FIG. 4A is a cross-sectional view of the embodiment shown in FIG. 2.

FIG. 2 is a three-dimensional illustration of an embodiment of a light-emitting device according to the invention. FIG. 3 is an exploded view of the embodiment shown in FIG. 2. FIG. 4A is a cross-sectional view of the embodiment shown in FIG. 2. As shown in these figures, the light-emitting device 200 includes a molded body 201 and a lens 202. The molded body 201 has raised edges that form a concave portion. At the bottom of the concave portion are metal leads 203, which extend to the outer edges of the molded body 201, and a plane surface 205. A light-emitting element 204 (e.g., a light-emitting diode) is mounted onto the plane surface 205 and is wire bonded to the metal leads 203 for receiving electric power.

The lens 202 includes a central portion 206, an edge portion 207 surrounding the central portion 206, and a base portion 208 supporting the central portion 206 and the edge portion 207. The central portion 206 is a dome-shaped structure symmetric across its central axis 206a. It has a dome-shaped top surface 209. The edge portion 207 has an inner top surface 210 and an outer top surface 211. The inner top surface 210 of the edge portion 207 connects with the dome-shaped top surface 209 of the central portion 206 to form a valley-shaped groove. In one embodiment, the cross-section line 211c of the outer top surface 211 is a straight line. The line 211c forms an angle θ with the central axis 206a of the central portion 206. To achieve an ideal result of focusing the light emitted from the light-emitting element 204, the edge portion 207 is shaped to ensure the angle θ is between 0-45°. In another embodiment, the line 211c may be a curved line, where any angle formed by any plane tangent to the outer top surface 211 of the edge portion 207 and the central axis 206a shall also be between 0-45° to achieve the same ideal light focusing result. Similarly, the cross-section line of the inner top surface 210 may be a straight or curved line as well.

In addition, the bottom part of the base portion 208 is attached onto the molded body 201 to form a sealed chamber 212 to enclose the light-emitting element 204. The sealed chamber 212 may be a vacuum chamber or contains air, dinitrogen, argon, or certain special gases such as inert gas.

In one embodiment, the molded body 201 is molded from Epoxy Molding Compound, Silicon Molding Compound, or ceramics. During the molding process, the metal leads 203 are integrated as part of the molded body 201. The lens 202 is molded from silica gel, resin, or epoxy. The manufacturing process of the light-emitting device 200 is discussed below in detail.

Figure 4B:
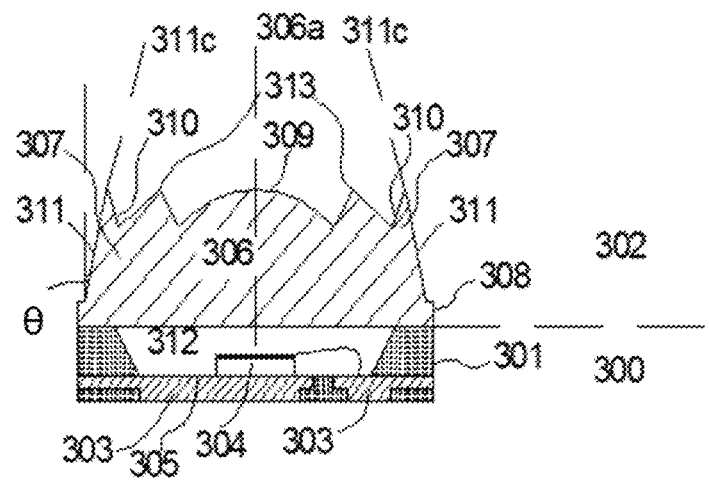
FIG. 4B is a cross-sectional view of an alternative embodiment of the light-emitting device shown in FIG. 4A.

FIG. 4B is a cross-sectional view of an alternative embodiment of the light-emitting device shown in FIG. 4A. Like the embodiment shown in FIG. 4A, the light-emitting device 300 has a molded body 301 and a lens 302. The molded body 301 has raised edges that form a concave portion. At the bottom of the concave portion are metal leads 303, which extend to the outer edges of the molded body 301, and a plane surface 305. A light-emitting element 304 is mounted onto the plane surface 305 and is wire bonded to the metal leads 303 for receiving electric power.

The lens 302 includes a central portion 306, a middle portion 313 surrounding the central portion 306, and an edge portion 307 surrounding the middle portion 313, and a base portion 308 supporting the central portion 306, the middle portion 313, and the edge portion 307. The central portion 306 is a dome-shaped structure symmetric across its central axis 306a. It has a dome-shaped top surface 309. The middle portion 313 surrounds the dome-shaped central portion 306 and has an upside-down "v" shaped cross-section. The edge portion 307 has an inner top surface 310 and an outer top surface 311. The inner top surface 310 of the edge portion 307 connects with the upside-down "v" shaped top surface of the middle portion 313 to form a valley-shaped groove. In one embodiment, the cross-section line 311c of the outer top surface 311 is a straight line. The line 311c forms an angle θ with the central axis 306a of the central portion 306. To achieve an ideal result of focusing the light emitted from the light-emitting element 304, the edge portion 307 is shaped to ensure the angle θ is between 0-45°. In another embodiment, the line 311c may be a curved line, where any angle formed by any plane tangent to the outer top surface 311 of the edge portion 307 and the central axis 306a shall also be between 0-45° to achieve the same ideal light focusing result. Similarly, the cross-section line of the inner top surface 310 may be a straight or curved line as well.

In addition, the bottom part of the base portion 308 is attached onto the molded body 301 to form a sealed chamber 312 to enclose the light-emitting element 304. The sealed chamber 312 may be a vacuum chamber or contains air, dinitrogen, argon, or certain special gases such as inert gas.

Figure 4C:
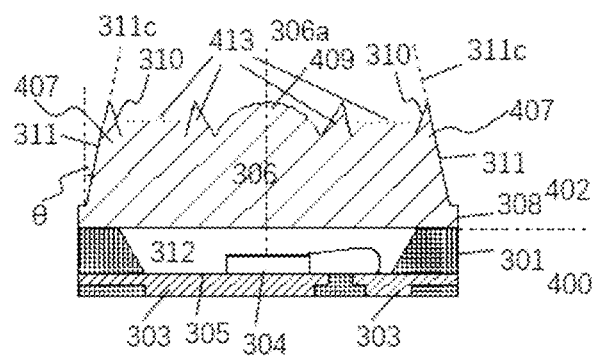
FIG. 4C is a cross-sectional view of an alternative embodiment of the light-emitting device shown in FIG. 4A.

FIG. 4C is a cross-sectional view of an alternative embodiment of the light-emitting device shown in FIG. 4A. The light-emitting device 400 is similar to the light-emitting device 300 (shown in FIG. 4B) except that the lens 402 has a plurality of upside-down "v" shaped middle portions 413, each surrounding another with the inner-most one surrounding the dome-shaped central portion 409 and the outer-most one being surrounded by the edge portion 407.

Figure 5:
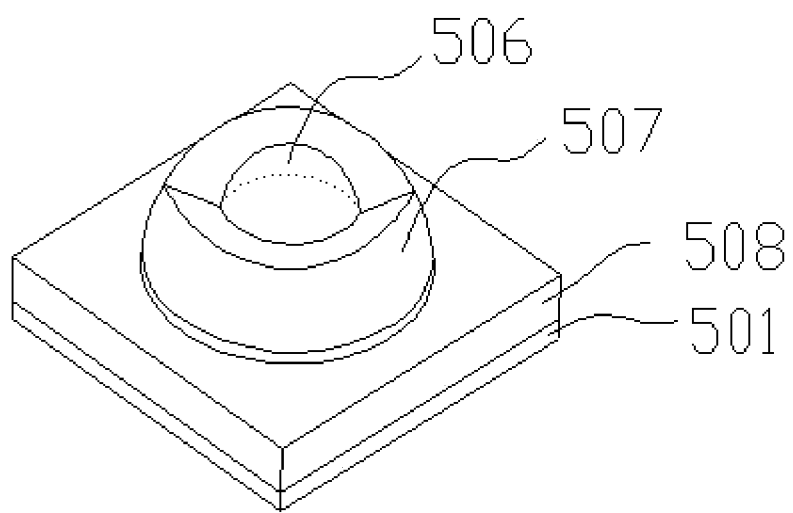
FIG. 5 is a three-dimensional illustration of another embodiment of a light-emitting device according to the invention.
Figure 6:
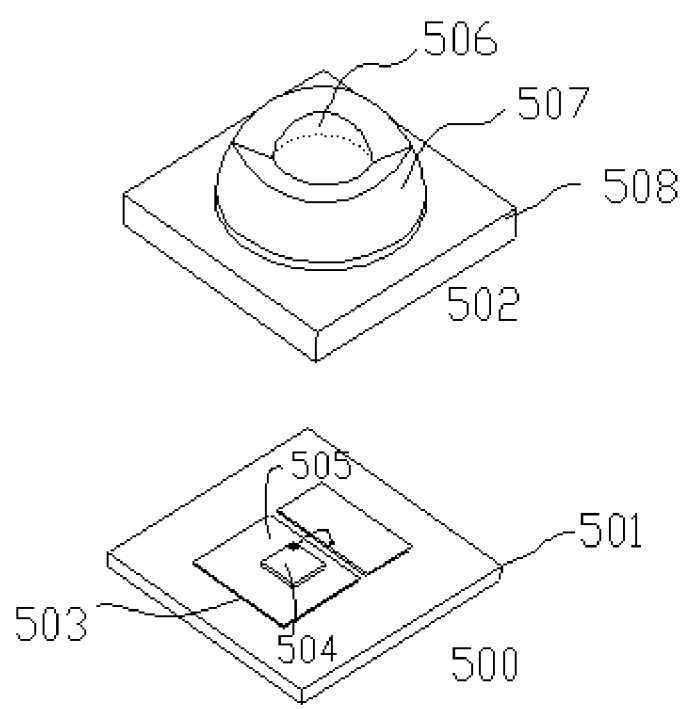
FIG. 6 is an exploded view of the embodiment shown in FIG. 5.
Figure 7:
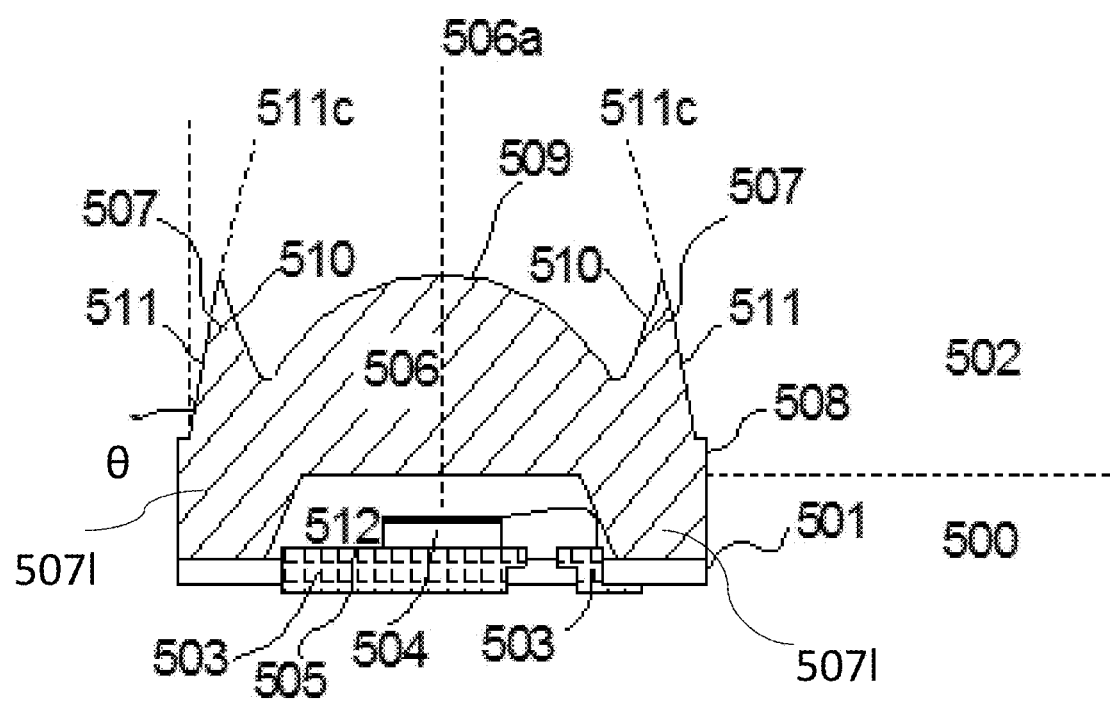
FIG. 7 is a cross-sectional view of the embodiment shown in FIG. 5.

FIG. 5 is a three-dimensional illustration of another embodiment of a light-emitting device according to the invention. FIG. 6 is an exploded view of the embodiment shown in FIG. 5. FIG. 7 is a cross-sectional view of the embodiment shown in FIG. 5. As shown in these figures, the light-emitting device 500 includes a molded body 501 and a lens 502. Different from the embodiment shown in FIGS. 2-4, the molded body 501 is flat and does not have raised edges. The molded body 501 has a plane surface 505 and metal leads 503, which extend to the bottom of the molded body 501. A light-emitting element 504 (e.g., a light-emitting diode) is mounted onto the plane surface 505 and is connected to the metal leads 503 for receiving electric power.

The lens 502 includes a central portion 506, an edge portion 507 surrounding the central portion 506, and a base portion 508 supporting the central portion 506 and the edge portion 507. The central portion 506 is a dome-shaped structure symmetric across its central axis 506a. It has a dome-shaped top surface 509. The edge portion 507 has an inner top surface 510 and an outer top surface 511. The inner top surface 510 of the edge portion 507 connects with the dome-shaped top surface 509 of the central portion 506 to form a valley-shaped groove. In one embodiment, the cross-section line 511c of the outer top surface 511 is a straight line. The line 511c forms an angle θ with the central axis 506a of the central portion 506. To achieve an ideal result of focusing the light emitted from the light-emitting element 504, the edge portion 507 is shaped to ensure the angle θ is between 0-45°. In another embodiment, the line 511c may be a curved line, where any angle formed by any plane tangent to the outer top surface 511 of the edge portion 507 and central axis 506a shall also be between 0-45° to achieve the same ideal light focusing result. Similarly, the cross-section line of the inner top surface 510 may be a straight or curved line as well.

In this embodiment, the edge portion 507 has extended leg 5071. When the base portion 508 is attached onto the molded body 501, the extended leg 5071, the central portion 506, and the base portion 508 form a sealed chamber 512 to enclose the light-emitting element 504. The sealed chamber 512 may be a vacuum chamber or contains air, dinitrogen, argon, or certain special gases such as inert gas.

Although not shown in the figures, the plane surface 205 or 505 described in the above embodiments may have a sunk area for mounting the light-emitting element so that the lens may be made closer to the plane surface. This design can help to reduce the overall height of the light-emitting device. The sunk area may be created by etching if it is located on a metal lead or by molding if it is located on the molded material.

Figure 8:
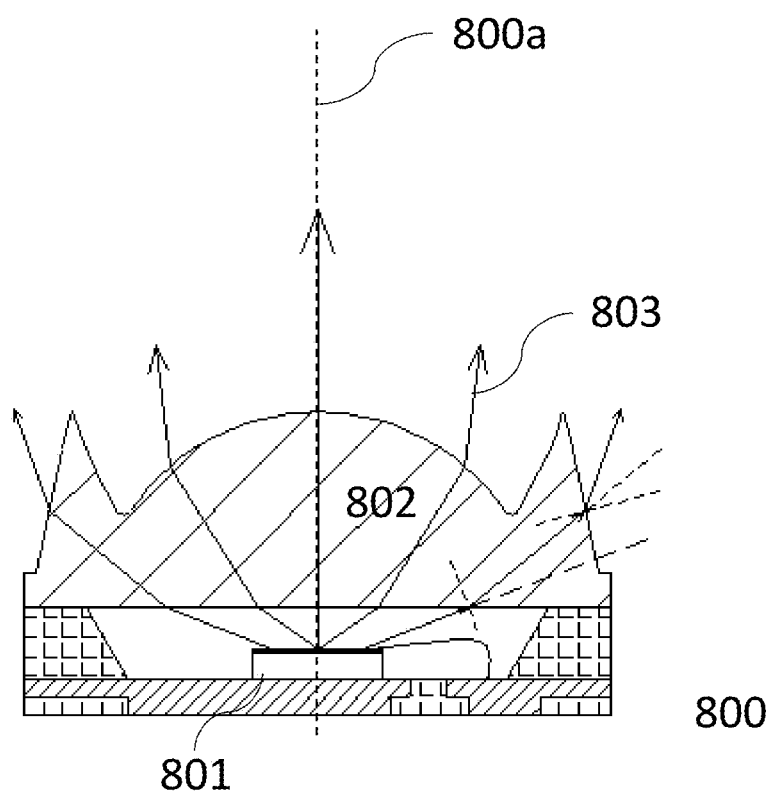
FIG. 8 is a two-dimensional illustration of the light focusing effect of an embodiment of a light-emitting device, where only the lens and the light-emitting element are shown for simplicity.

FIG. 8 is a two-dimensional illustration of the light focusing effect of an embodiment of a light-emitting device 800. The arrow lines 803 represent light emitted from the light-emitting element 801. In this embodiment, the lens 802 is symmetric across the vertical axis 800a of the light-emitting device 800 and the center of the light-emitting element 801 is positioned on the vertical axis 800a. As shown, the lens 802 focuses the light 803 emitted from the light-emitting element 801 symmetrically across the vertical axis 800a when the light 803 travels from the sealed chamber into the lens 802 and then exits the lens 802 into the air, due to the shape of the lens 802 and the difference in refractive index between the lens and air.

Figure 9:
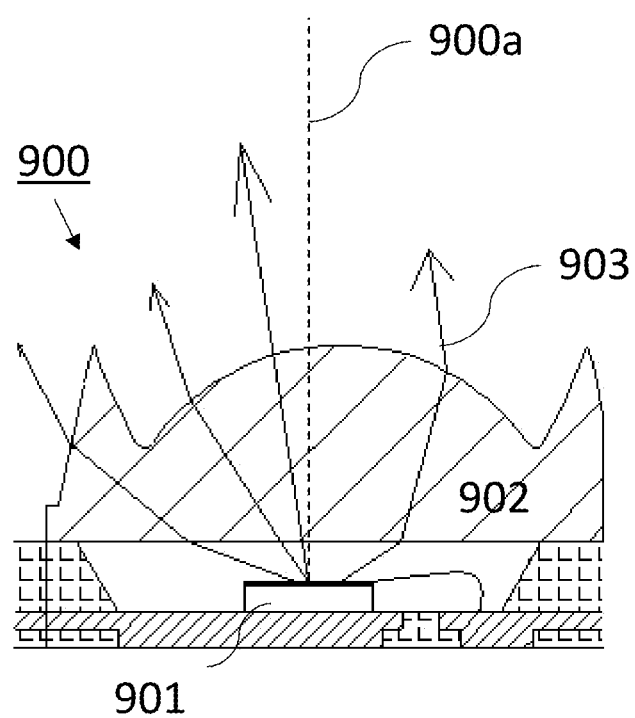
FIG. 9 is a two-dimensional illustration of the light focusing effect of another embodiment of a light-emitting device, where only the lens and the light-emitting element are shown for simplicity.

FIG. 9 is a two-dimensional illustration of the light focusing effect of another embodiment of a light-emitting device 900. As shown, the lens 902 is shifted horizontally and is no longer symmetrical across the vertical axis 900a of the light-emitting device 900. As such, light 903 emitted from the light-emitting element 901 is focused but bended with an angle. Vice versa, although not shown, the light-emitting element 901 may be shifted horizontally away from the vertical axis 900a whereas the lens 902 remain symmetrical across the axis 900a. This design is particularly useful for mobile iris recognition systems (e.g., iris system on a smartphone) where users usually look at the system from an angle. With this build-in tilt emission, no mechanical tilt of the light source is needed. As such, the light-emitting device can be soldered directly on mainboard, bringing cost saving in both materials and manufacturing.

Figure 10:
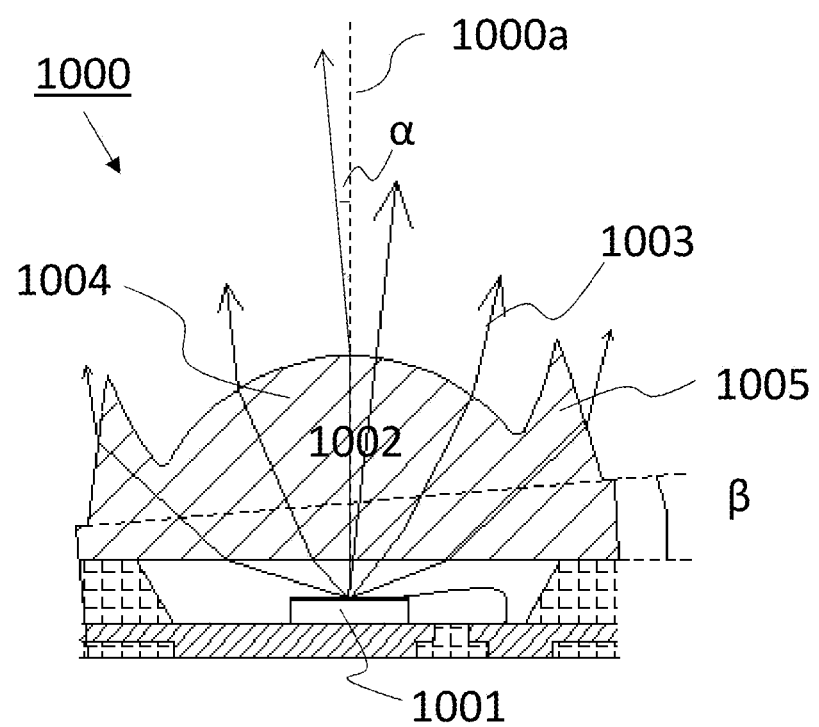
FIG. 10 is a two-dimensional illustration of the light focusing effect of another embodiment of a light-emitting device, where only the lens and the light-emitting element are shown for simplicity.

FIG. 10 is a two-dimensional illustration of the light focusing effect of another embodiment of a light-emitting device 1000. Different from the embodiments shown in FIGS. 9 and 10, the lens 1002 is not symmetric across the vertical axis 1000a of the light-emitting device 1000. In this embodiment, the central portion 1004 and the edge portion 1005 are tilted together with an angle β towards a direction. The light-emitting element 1001 is positioned on the vertical axis 1000a. As shown, the light 1003 emitted from the light-emitting element 1001 is focused but bend with an angle α. Because a lens 1002 may be easily molded from materials such as silica gel, resin, or epoxy, no mechanical tilt of the light source is needed. The light-emitting device can be soldered directly on mainboard, bringing cost saving in both materials and manufacturing. Of course, the light-emitting element 1001 may be positioned off the vertical axis 1000a with a distance, such as the embodiment described in FIG. 9, to further enhance the light bending effect.

Figure 11A:
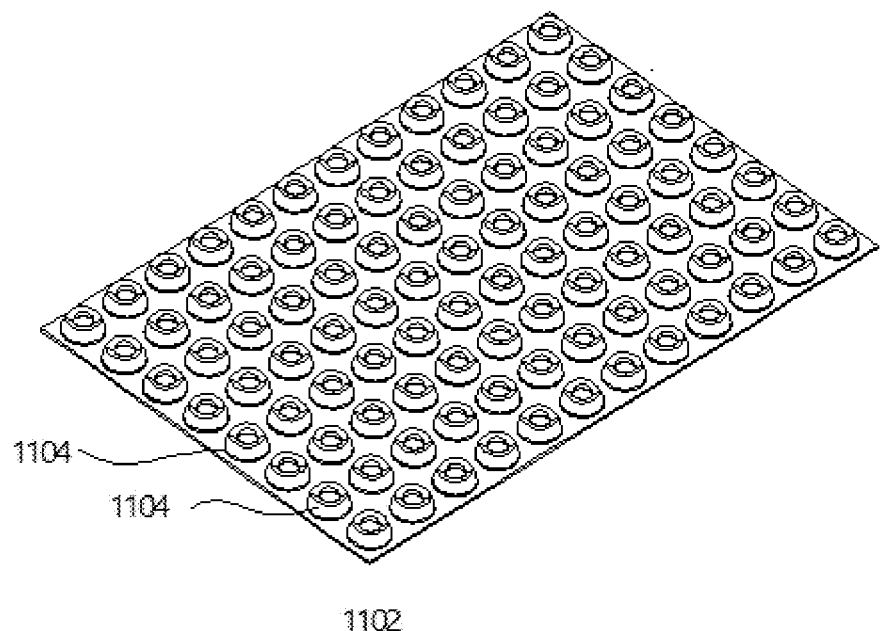
FIGS. 11A-B are perspective views illustrating a method for manufacturing the light-emitting devices according to the invention.
Figure 11A:
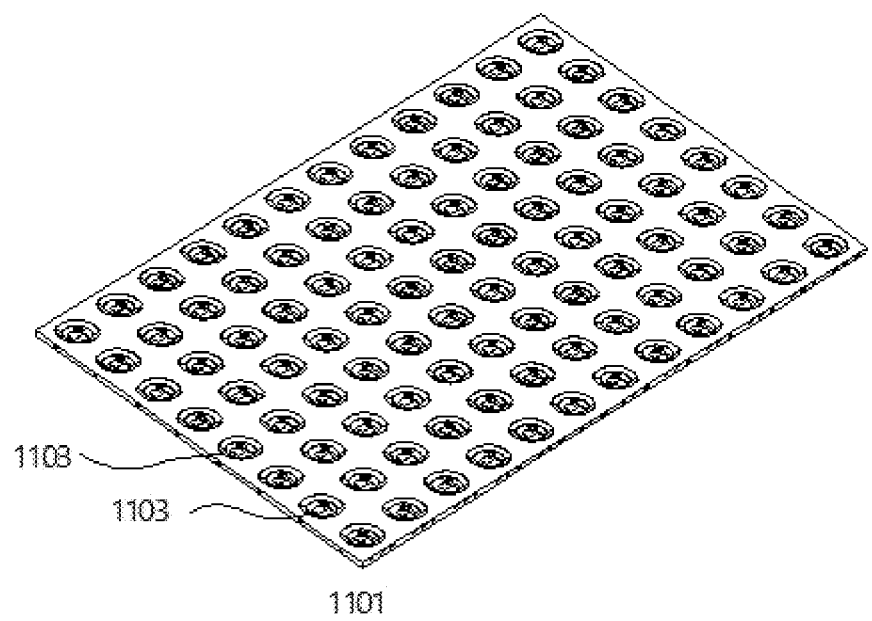
Figure 11B:
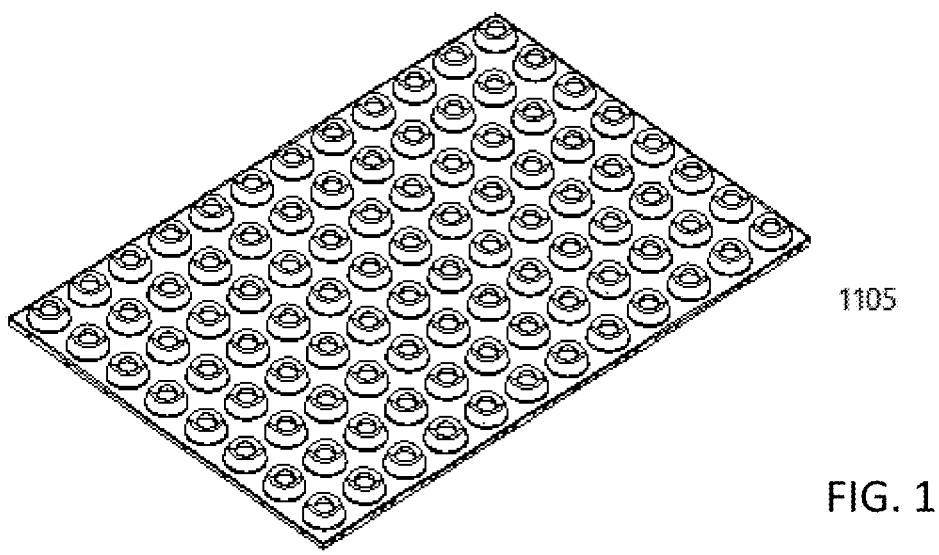

FIGS. 11A-B are perspective views illustrating a method for manufacturing the light-emitting devices according to the invention. As shown, during the manufacturing process, a sheet of molded structure 1101 is provided. The sheet of molded structure 1101 includes an array of molded bodies 1103 having metal leads, such as the molded bodies 201 or 501 described above. For mass production purposes, the sheet of molded structure 1101 is formed as an integral structure in an industrial-scale molding process, such as the process described in Ichikawa. The sheet of molded structure 1101 may be molded from materials including but not limited to Epoxy Molding Compound, Silicon Molding Compound, and ceramics. Then, a light-emitting element, such as light-emitting diode, is mounted onto each molded body 1103 and wire bonded to the corresponding metal leads. Then, a sheet of molded structure 1102 including an array of lenses 1104 is provided. Each lens 1104 may be formed as any lens embodiment described above. Like the sheet of molded structure 1101, the sheet of molded structure 1102 is formed as an integral structure in an industrial-scale molding process. The sheet of molded structure 1102 may be molded from materials including but not limited to silica gel, resin, and epoxy. Then, adhesives, such as epoxy, resin, or silicone, are applied onto the top surface of the sheet of molded structure 1101 and/or the bottom surface of the sheet of molded structure 1102. The two sheets of molded structures are bonded together by, for example, applying pressure and heat. After the bonding process, small sealed chambers are formed between each individual molded body 1103 and corresponding lens 1104. During the bonding process, air may be vacuumed out of the sealed chambers or certain special gas may be injected into the sealed chambers. Alternatively, regular air may be left in the sealed chambers.

FIG. 11B shows the bonded structure 1105. The bonded structure 1105 is then cut along the x and y axis to create individual light-emitting devices. Because the light-emitting elements are sealed inside the sealed chamber after the bonding process, dust created by the cutting process cannot get in contact with the light-emitting elements. As such, each sealed chamber provides a clean working environment for the light-emitting element, increasing the life expectancy of the device and production yield.

Figure 12A:
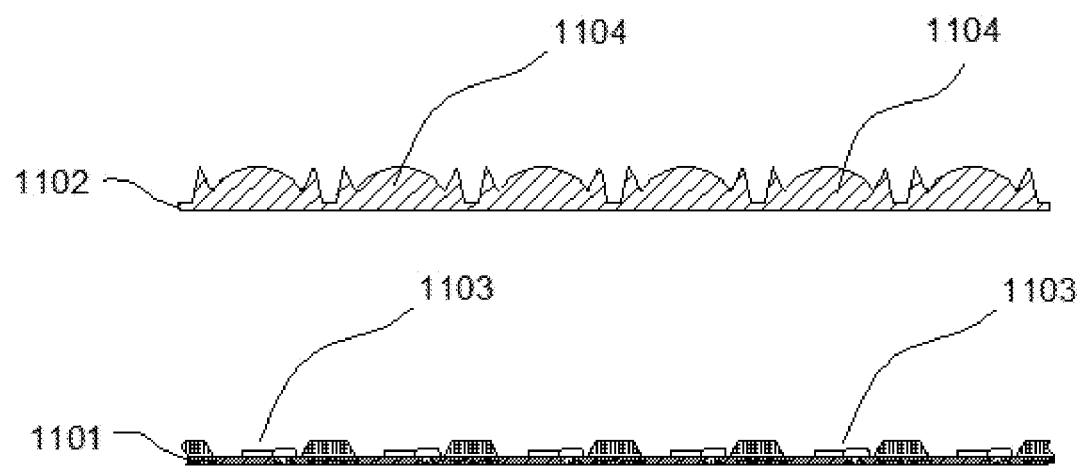
FIGS. 12A-B are sectional views of the manufacturing method illustrated in FIGS. 11A-B.
Figure 12B:

FIGS. 12A-B are sectional views of the manufacturing method illustrated in FIGS. 11A-B. Although the embodiment illustrated in FIGS. 2-4 is used here to describe the method of manufacturing, other embodiment of lens and/or molded body may also be manufactured through this method, as long as the corresponding sheet of molded structures are provided.

Figure 13:
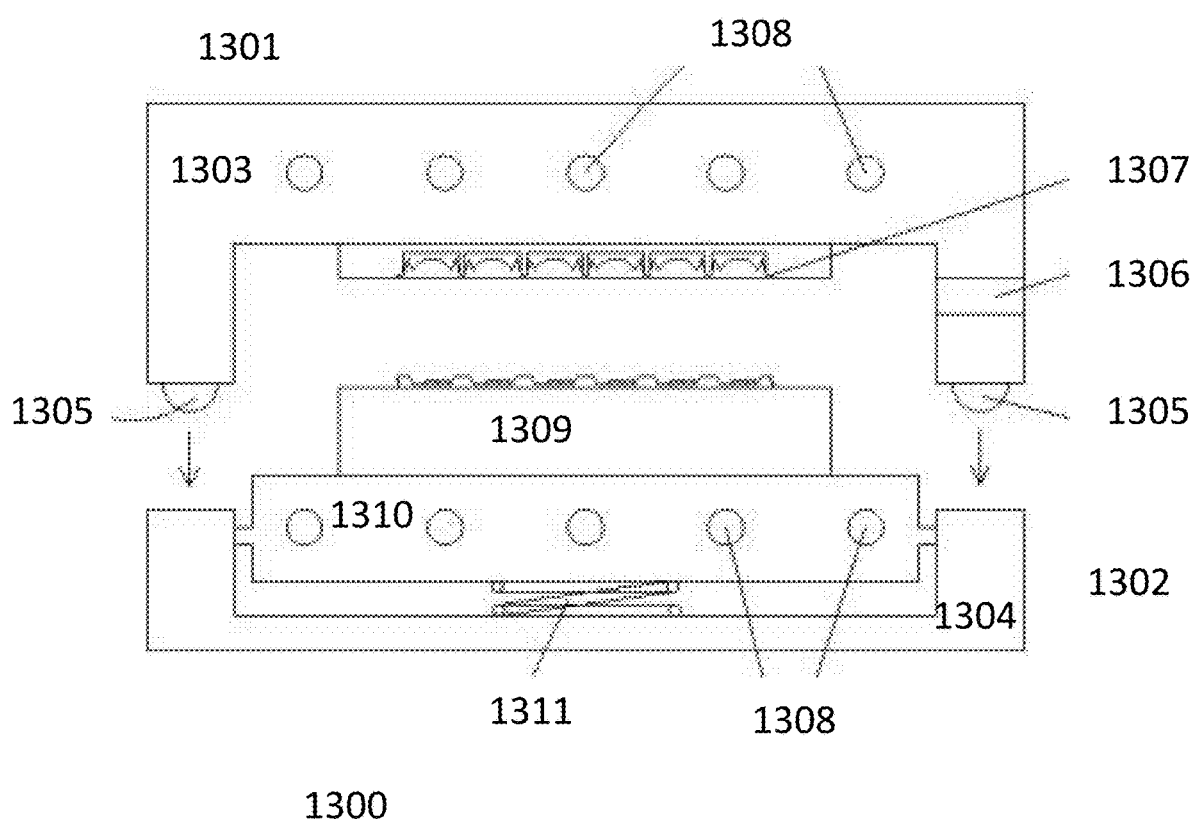
FIG. 13 is a sectional view of using a heat-pressing machine for the manufacturing method illustrated in FIGS. 11A-B and 12A-B.

FIG. 13 is a sectional view of a heat-pressing machine used for the manufacturing method illustrated in FIGS. 11A-B and 12A-B. As shown, the heat-pressing machine 1300 includes a cover part 1301 and a base part 1302. The cover part 1301 has a cover shell 1303. The base part 1302 has a base shell 1304. When the two shells 1303 and 1304 are coupled together, they form a chamber. Sealing washers 1305 are added between the shells 1303 and 1304 so that the chamber may be sealed securely. A vacuum port 1306 is provided on the shell 1303 (or on shell 1304) so that air may be vacuumed out of the chamber. In addition, other gas (e.g., dinitrogen, argon, inert gas) may be injected into the chamber after air is vacuumed. The cover part 1301 further includes a plurality of heating rods 1308 embedded inside the cover shell 1303 and a pressing pad 1307. The base part 1302 includes a pressing pad 1309 placed on a lifting table 1310. The lifting table 1310 is connected with the bottom of the base shell 1302 via a compression spring 1311. The compression spring 1311 is controlled externally to move the table up or down. The lifting table 1310 has a plurality of heating rods 1308. Alternatively, the pressing pad 1309 and the lifting table 1310 may be formed as a single part.

During manufacture, the sheet of molded body 1101 (described in FIGS. 11A-B and 12A-B) is placed on the pressing pad 1309 and the sheet of lenses 1102 is secured underneath the pressing pad 1307. Then, the sheet of lenses 1102 and the sheet of molded body 1101 are accurately aligned and adhesives are applied on the surface of the sheet of molded body 1101. Then, the cover shell 1103 and the base shell 1104 are coupled together to form a working chamber. At this moment, the two pressing pads 1307 and 1309 have not yet pressed the two molded sheets together. Rather, air is vacuumed out of the chamber, and optionally, dinitrogen, argon, or inert gas may be pumped into the chamber. After vacuuming step is finished, an external command instructs the compression spring 1311 to lift the lifting table 1310 and the pressing pad 1309 up to fully engage with the pressing pad 1307. The sheet of molded body 1101 and the sheet of lenses 1102 are pressed together. Meanwhile, the heating rods 1308 heat up the temperature inside the chamber to speed up the adhesives bonding of the two sheets. Thus, the bonded structure 1105 is formed and ready for being cut into individual light-emitting devices.

It should be noted that the light-emitting element used in the present invention may be an IR LED or a LED producing any light wavelength. The LED may be a lateral, vertical or flip chip. Also, the light-emitting element may be a CSP (chip-scale package) chip, white chip, VCSEL (vertical-cavity surface-emitting laser) chip, or SLED (super luminescent diode) chip. Alternatively, the light-emitting element may also be a die array.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

I claim:

1. A light emitting device of an iris recognition system, comprising:
   a molded body having metal leads and a plane surface for mounting a light-emitting element; and
   a lens having a central portion, an edge portion surrounding the central portion, and a base portion supporting the central portion and the edge portion, wherein the central portion has a dome-shaped top surface, the edge portion consists of a single ring-shaped ridge structure having an inner top surface and an outer top surface, the inner top surface of the edge portion connects with the dome-shaped top surface of the central portion to form a valley-shaped groove, the base portion is attached onto the molded body to form a sealed chamber to enclose the light-emitting element, from the base portion the outer top surface of the single ring-shaped ridge structure gradually tilts inwardly towards the central portion, and any angle formed by any plane tangent to the outer top surface of the edge portion and a central axis of the central portion is greater than zero degrees and less than forty-five degrees.

2. The light emitting device of claim 1, wherein the molded body has raised edges for bonding with the base portion of the lens to create the sealed chamber.

3. The light emitting device of claim 1, wherein the molded body is molded from Epoxy Molding Compound, Silicon Molding Compound, or ceramics.

4. The light emitting device of claim 1, wherein the lens is molded from silica gel, resin, or epoxy.

5. The light emitting device of claim 1, wherein the sealed chamber is a vacuum chamber or contains one of air, dinitrogen, and inert gas.

6. The light emitting device of claim 1, wherein the light-emitting element comprises an infrared light emitting diode, a regular light-emitting diode, a die array, a chip-scale package chip, a white chip, a vertical-cavity surface-emitting laser chip, or a super luminescent diode chip.

7. The light emitting device of claim 1, wherein the lens and the light-emitting element are both positioned symmetric across a vertical axis of the light-emitting device.

8. The light emitting device of claim 1, wherein the lens is positioned symmetric across a vertical axis of the light-emitting device whereas the light-emitting element is positioned off the vertical axis.

9. The light emitting device of claim 1, wherein the lens is positioned off a vertical axis of the light-emitting device whereas the light-emitting element is positioned symmetric across the vertical axis.

10. The light emitting device of claim 1, wherein the central portion and the edge portion of the lens are formed to tilt with an angle.

* * * * *